United States Patent
Haycock

(12) 
(10) Patent No.: US 6,704,365 B2
(45) Date of Patent: Mar. 9, 2004

(54) DATA TRANSMISSION DRIVER DEVICE

(75) Inventor: Robert John Haycock, Stockport (GB)

(73) Assignee: Xyratex Technology Limited, Havant (GB)

( * ) Notice: Subject to any disclaimer, the term of this patent is extended or adjusted under 35 U.S.C. 154(b) by 344 days.

(21) Appl. No.: 09/853,013

(22) Filed: May 10, 2001

(65) Prior Publication Data

US 2001/0030622 A1 Oct. 18, 2001

Related U.S. Application Data

(63) Continuation of application No. PCT/GB01/01077, filed on Mar. 12, 2001.

(30) Foreign Application Priority Data

Mar. 14, 2000 (GB) ................................. 0005976

(51) Int. Cl.[7] .............................. H04B 3/00; H04L 25/00
(52) U.S. Cl. ........................................ 375/257; 327/540
(58) Field of Search ................................. 375/257, 259, 375/260; 333/1, 19; 327/530, 538, 540 558

(56) References Cited

U.S. PATENT DOCUMENTS

| | | | |
|---|---|---|---|
| 4,027,259 A | 5/1977 | Zellmer | 333/28 R |
| 4,607,231 A | 8/1986 | Nakayama | 330/51 |
| 5,287,386 A | 2/1994 | Wade et al. | 375/36 |
| 5,323,423 A | 6/1994 | Townsend et al. | 375/14 |
| 5,444,410 A * | 8/1995 | Polhemus | 327/317 |
| 5,471,170 A | 11/1995 | Genest | 330/151 |
| 5,486,777 A | 1/1996 | Nguyen | 326/68 |
| 5,533,054 A | 7/1996 | DeAndrea et al. | 375/286 |
| 5,966,032 A | 10/1999 | Elrabaa et al. | 326/84 |

FOREIGN PATENT DOCUMENTS

| | | |
|---|---|---|
| DE | 3234737 | 3/1984 |
| EP | 0858195 | 8/1998 |
| GB | 2094592 | 9/1982 |

OTHER PUBLICATIONS

Pending U.S. Patent Application 09/808,613.

* cited by examiner

Primary Examiner—Jean B. Corrielus
(74) Attorney, Agent, or Firm—Pillsbury Winthrop LLP

(57) ABSTRACT

A driver transmits data as a difference in the currents along two transmission lines. The driver provides a difference in the currents which is greater for relatively high frequency components, by transmitting relatively low frequency components in the data to both of the transmission lines. The degree to which low frequency components are transmitted to one of the lines is dependent upon the width (gain) of a transistor, and thus may be varied by changing the transistor width rather than the value of a passive component. In some versions of the device, the frequency response of the driver can be varied by selecting combinations of transistors to provide this gain. A calibration method allows the variable response to be tuned to properties of the transmission lines.

9 Claims, 8 Drawing Sheets

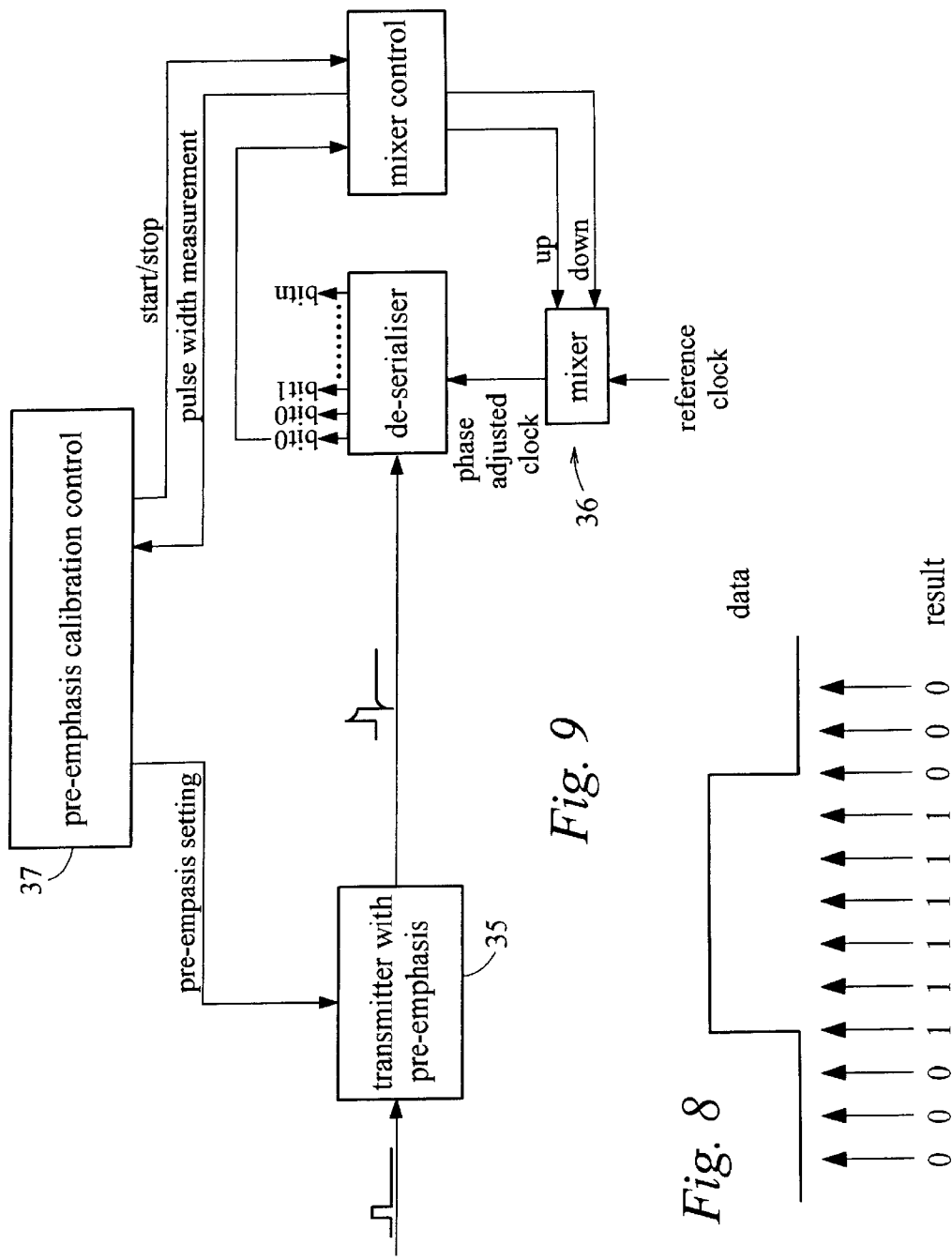

DATA TRANSMISSION DRIVER DEVICE

This is a continuation of application No. PCT/GB01/01077 filed Mar. 12, 2001.

FIELD OF THE INVENTION

The present invention relates to a driver for data transmission, and particularly to a driver which provides frequency dependent pre-emphasis. It further relates to a data transmission system employing the driver, and a method for calibrating the system.

BACKGROUND OF THE INVENTION

The frequency response of a interconnect (e.g. a PCB/cable) used for data transmission attenuates the high frequency components of a data stream. The level of this attenuation is illustrated schematically in FIG. 1, showing that it arises at above a frequency labelled $\omega_2$. When the attenuation starts below the maximum frequency of the data stream, this leads to a phenomenon known as inter-symbol interference (ISI), in which certain data patterns cause thinning of the data pulse widths, and hence there is data dependent jitter. A worst case example of this is for a data pattern in which the transmitted data has a single data high amongst data lows, as shown in FIG. 2(a). The attenuation of the high frequency components of the single data high results in a pulse which has reduced amplitude and long rise/fall times. Consequently pulse widths are reduced as shown in FIG. 2(b).

The CML type driver, illustrated in FIG. 3, includes a differential pair at the transmitter and loads at the receiver. The two inputs (which are equal and opposite voltage signals) are amplified by an amplifier 1, and then fed as equal and opposite signals txn and txp to respective transistors 3,5. The transmission lines 7, 9 have an impedance $Z_0$. The loads R are at the termination for the transmission lines, connecting them to a voltage $V_{dd}$. An rx amp 10 is provided at the output. The gain of the driver is proportional to the width of the transistors 3,5 in the differential pair. Wider transistors provide more gain. A CML-type driver illustrated in FIG. 3 provides equal gain at all frequencies.

However, drivers are known which provide a pre-emphasis which flattens the frequency response of the interconnect at higher frequencies, preferably up to and beyond the data signal frequency. This is illustrated in FIG. 4, in which FIG. 4(a) is the frequency response of the interconnect, FIG. 4(b) is the frequency response of the pre-emphasis filter which has a pole at $\omega_2$, and FIG. 4(c) is the frequency response of the combination of the two, which is flat up to frequency $\omega_1$. The pre-emphasis filter has a zero at $\omega_2$ to cancel the attenuation of the interconnect. The pre-emphasis filter also has a pole at $\omega_1$ but this is higher than the maximum data frequency. Such known drivers employ passive components to achieve the frequency response shown in FIG. 4(b). This means that, taking the pre-emphasis and data transmission period as a whole, low and high frequency components are both attenuated by the same amount, and little or no thinning of the pulse widths occurs.

SUMMARY OF THE INVENTION

The present invention seeks to provide a new and useful driver for data transmission.

In general terms, the present invention proposes a system in which data encoded in two equal and opposite input signals is transmitted along two transmission lines (which each extend from a first location to a second location) as a difference between currents on the two lines. Each input signal is used to regulate (modulate) a current which passes along a different respective one of the lines, and, additionally, relatively low frequency components of each input signal component are used to regulate a current which is directed along the other respective one of the lines. Thus, the difference in the total currents on the two lines is greater for high frequency components than for low-frequency components.

Specifically, the first expression of the present is a data transmission system including:

a pair of electrical transmission lines;

a current source connected to each of said lines;

a transmission regulator which is arranged to receive data as two opposite input signals, and to transmit the data along the transmission lines as a difference between the currents at a first end of the lines; and measurement means for measuring the difference between the currents at a second end of the lines, and from the difference extracting the data;

wherein the transmission regulator is arranged to divide each input signal into two components, and for each input signal:

to modify the current in a respective first one of the transmission lines using a first component of that input signal, and to apply a low-pass filter to the other component of that input signal, and using the output of the low-pass filter to modify the current in the respective other one of the transmission lines;

whereby the difference between the currents in the two lines is greater for higher frequency components than for low frequency components.

Preferably, the degree to which the output of each low-pass filter modifies the respective other one of the transmission lines, is variable. This permits the transmission regulator to be tuned according to the frequency characteristics of the transmission lines.

The possibility of tuning may be achieved, for example, by selectively feeding the output of the low pass filters to a control input (e.g. gate/base) of a plurality of regulating elements (e.g. transistors) which regulate a current directed through the other one of the transmission lines. Switching elements may be provided to determine which of the regulating elements are selected. Thus, the amplification of the low frequency components may be performed using a selected combination of these regulating elements.

Varying the regulation by controlling whether or not transistors are selected has particular advantages over pre-emphasis using passive components: firstly, the manufacture of transistors can be controlled very accurately, and thus the degree of influence of the low frequency components can be controlled very accurately by controlling which transistors are used (by contrast resistors are often inaccurate); secondly, modern CMOS process targets digit technologies very aggressively, so resistors and capacitors are not always supported; thirdly, accurate transistor models for simulations are always available, but not capacitors or resistors.

Furthermore, the system according to the present invention can be arranged to ensure that the worst case pulse (e.g. a pulse which is part of a signal profile in which all the rest of the profile has opposite polarity) has a larger amplitude than would be possible by relying on a conventional passive pre-emphasis filter (i.e. there is gain).

Furthermore, the system according to the present invention can be arranged with only a low number of devices in series, so that the system is amenable to low voltage applications (say, signals of only up to 5V, or even only up to 2V).

As pointed out above, the transmission characteristics of a given transmission line are usually unknown. In this case, it is useful to provide a procedure for selecting the combination of regulating elements used, so that the characteristics of the pre-emphasis are matched to the transmission characteristics.

This can be accomplished by initially setting the switches of the regulator so that the influence of the low-pass filtered signals on the current is lowest (i.e the pre-emphasis of the high frequency portions of the signal is lowest); transmitting pulses of known length (e.g. worst case—that is narrowest—pulses); measuring the duration of the received pulse; and gradually modifying the switches to increase the influence of the low-pass filtered signals until the measured duration of the pulse is as great as the transmitted duration (to within a certain tolerance).

A second expression of the present invention is a driver for use in the system defined above.

A further aspect of the invention resides in a method of calibrating a system, including but not limited to a system as defined above, which includes a device for differentially amplifying low frequency components and high frequency components in a received signal, and in which the amplified signal is transmitted from a first end of a transmission line to a second end of the transmission line, the method including:

repeatedly generating pulses of known duration;

amplifying low frequency components and high frequency components in the generated pulses to different degrees to form a modified pulse;

transmitting the modified pulses along the line from the first end;

measuring the duration of the received pulses received at the second end; and increasing the degree to which high frequency components are amplified relative to low frequency components until the measured duration of the received pulses is equal to the known duration of the generated pulses to within a predetermined tolerance.

BRIEF DESCRIPTION OF THE DRAWINGS

Non-limiting embodiments of the invention will now be described for the sake of example only with reference to the accompanying drawings in which:

FIG. 8 illustrates a calibration technique for calibrating the driver of FIGS. 5 and 7;

FIG. 9 illustrates a system for performing the calibration technique of FIG. 8.

DETAILED DESCRIPTION OF EMBODIMENTS

Figure 3:
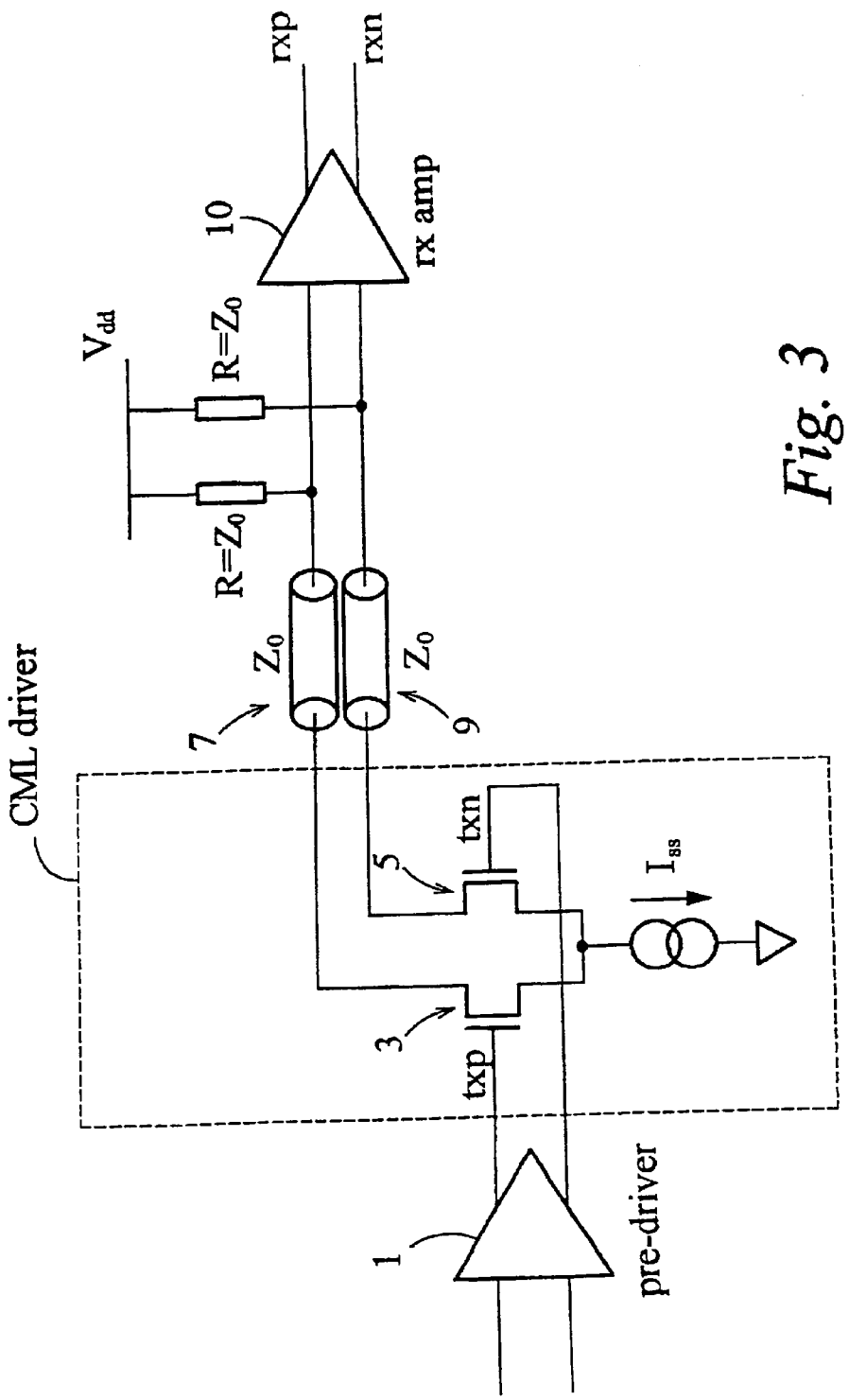
FIG. 3 shows a known CDL driver.
Figure 5:
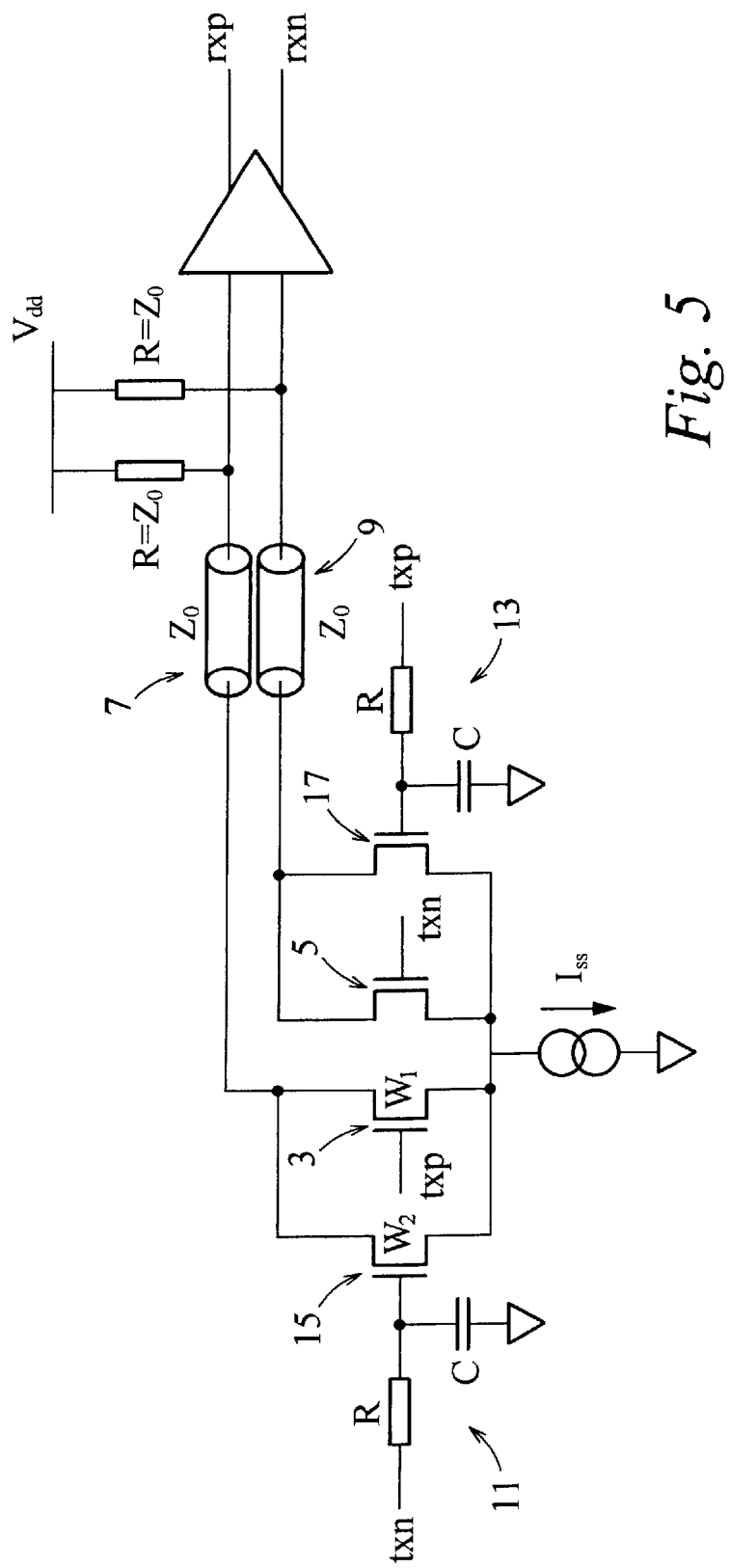
FIG. 5 shows a first driver according to the invention.

A first embodiment of the invention is illustrated in FIG. 5. In the differential pair for this version of the CML driver, there are, in comparison with the driver of FIG. 3, two low pass filters 11,13, which each consist of a resistor R and capacitor C, and additional transistors 15,17. The transistors 15, 17 each have a width (which is proportional to gain) $W_2$. Each of the two complementary (equal and opposite) input signals are amplified to form equal and opposite signals txp and txn, are these are divided into two signal paths (by components which are not shown). Note that the amplification may alternatively be performed after the signals txp are divided. For each signal, a first signal path leads to a respective transistor 3,5 of width $W_1$ and controls a current through the transistor which is directed into a respective transmission line 7,9 in the manner described above in relation to FIG. 3; a second signal path passes through one of the low pass filters 11,13 to a respective one of the transistors 15, 17 of width $W_2$, which controls another current, which is directed to the respective other one of the transmission lines. In other words, each transmission line carries a current which is the sum of a current passing through a transistor of width $W_1$ and a current passing through a transistor of width $W_2$ which is controlled by a low-pass filtered version of the opposite input signal.

Therefore, for a low frequency signal, the gain of the driver (e.g. the signal which is passed to the first transmission line 9 compared to signal txp) is proportional to $W_1-W_2$ (i.e. width1–width2). At high frequencies, the low pass filters 11,13 mean that no signal is applied to the transistors 15,17, so that the gain of the driver is proportional to $W_1$. The width $W_1$ should be bigger than $W_2$, otherwise the correct frequency response will not be achieved, and as $W_2$ approaches $W_1$ the maximum difference in the two gains is achieved.

The measurement means located at the opposite "distal" end of the two transmission lines 7,9 is as discussed above in relation to the prior art. The currents flowing at the distal ends of the lines 7, 9 are amplified by an Rx amplifier to generate measurements rxp, rxn.

Figure 6:
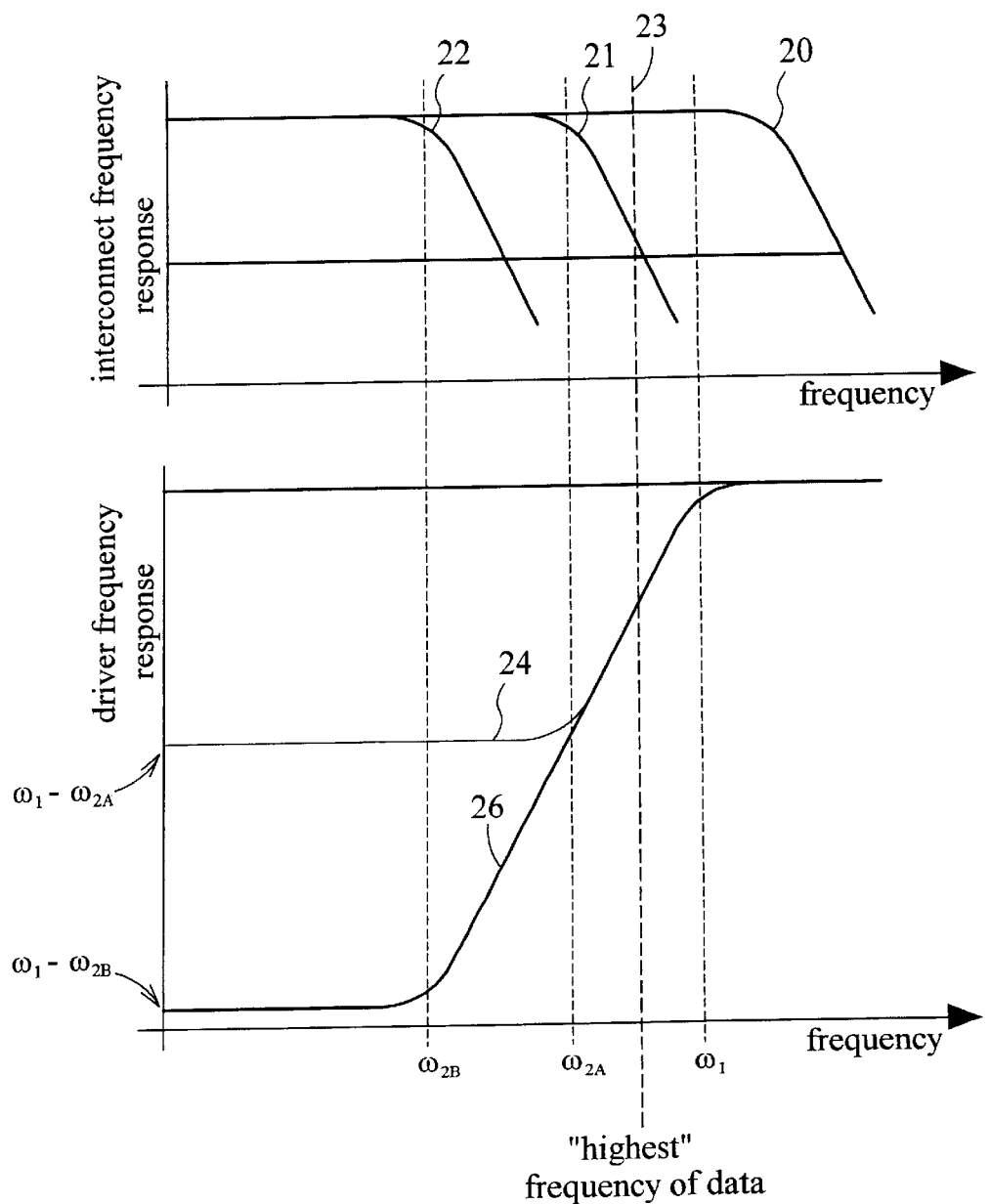
FIG. 6 illustrates the effect of the driver shown in FIG. 5.

We will now analyse in more detail, and in relation to FIG. 6, the operation of the driver of FIG. 5.

Figure 1:
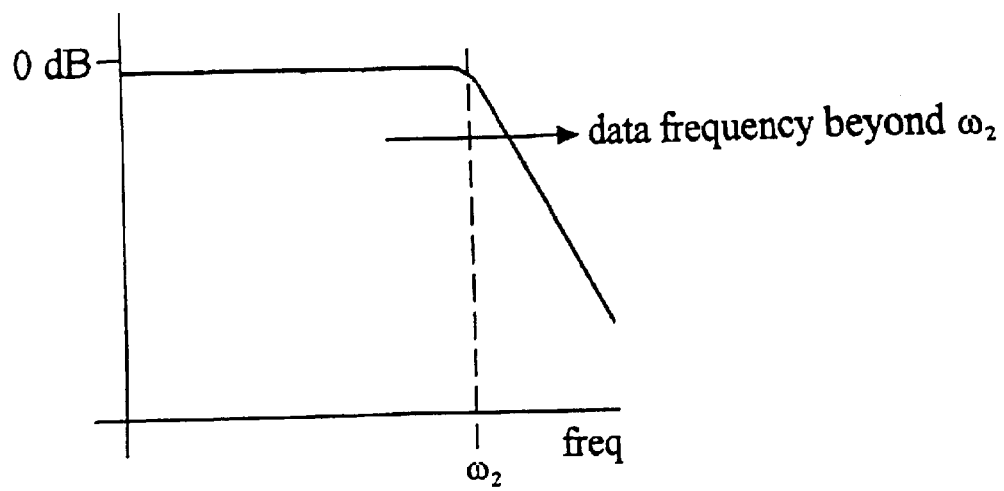
FIG. 1 shows a typical frequency response of a transmission line.
Figure 2:
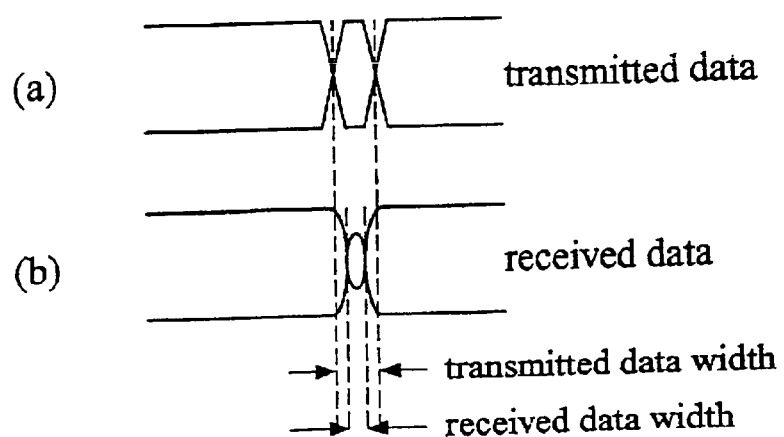
FIG. 2 shows the modification in transmitted data caused by transmission along the transmission line of FIG. 1.

The upper portion of FIG. 6 shows the frequency response of three transmission lines 20, 21, 22. A relatively short interconnect (e.g. with a length of a few cm) has a frequency response shown as 20, which is a plateau up to a relatively high frequency, but above this frequency gradually decreases ("rolls off"). This "roll-off" frequency is above the highest frequency present in the data marked by the dashed line 23, and so causes no problem. Typically, the frequency 23 is at least 200 MHz or at least 500 MHz, typically more than 1 GHz for $10^{11}$ of FR4 PCB. Progressively longer transmission lines have frequency responses 21, 22 with progressively lower roll-off frequencies $\omega_{2A}$, $\omega_{2B}$. Frequently, the roll-off frequency of a given transmission line is not known in advance. For a transmission line with a roll off frequency below the highest data frequency (which in typical high speed modern applications may happen when the transmission line is as short as only a few tens of centimeters), the problems illustrated in FIG. 2 will occur.

Turning to the lower portion of FIG. 6, lines 24,26 show the frequency response for two drivers according to FIG. 5 having the same value of $W_1$ but different respective values of $W_2$, namely $W_{2A}$ and $W_{2B}$ where $W_{2B}$ is closer to $W_1$ than $W_{2A}$. At high frequency, the maximum gain for each is $W_1$, but the gain of each line 24,26 decreases for frequencies below $\omega_1=1/(2\pi RC)$ and reaches its lowest value, determined by $W_1$ and $W_2$ at a lower frequency. Specifically, the gain of each driver decreases from $\omega_1$ by 20 dB/decade as a result of the filters, until it intercepts the minimum gain $(W_1-W_2)$ of the drive. This minimum gain is thus achieved at a frequency (respectively $\omega_{2A}$ and $\omega_{2B}$) which depends upon the respective values $W_{2A}$ and $W_{2B}$.

Figure 4:
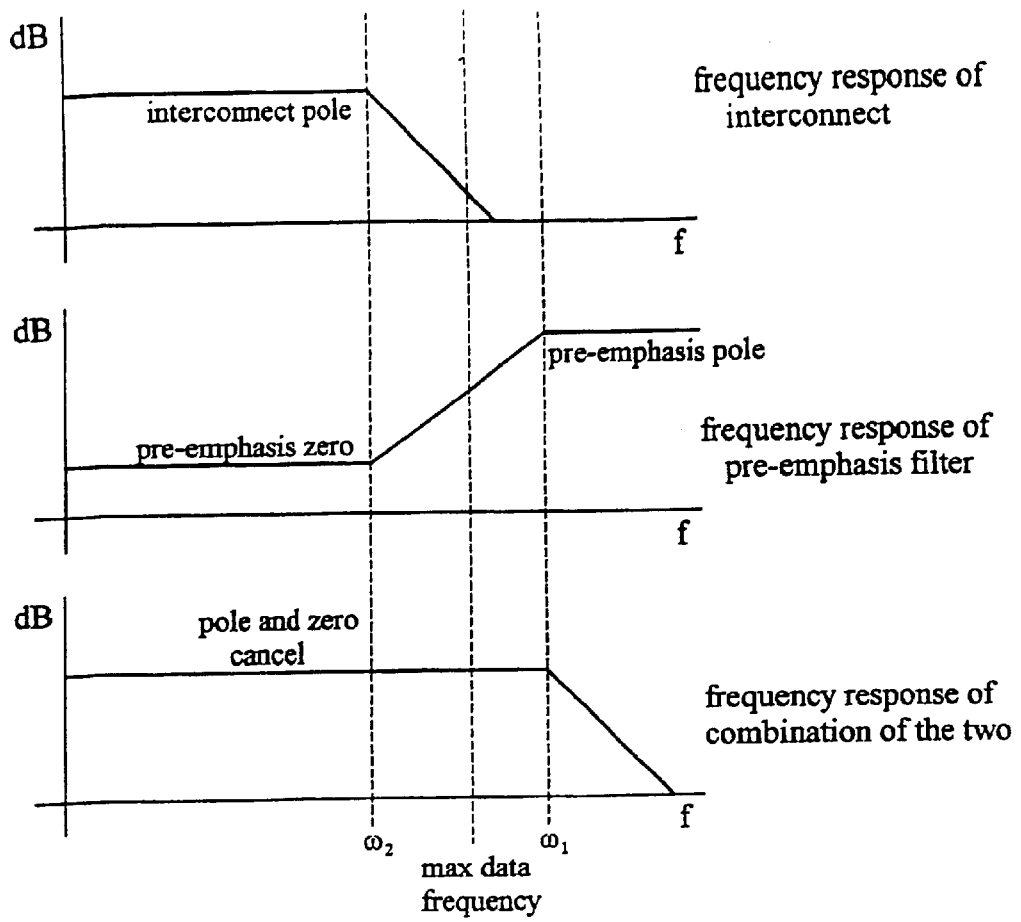
FIG. 4 shows a known pre-emphasis technique.

The gain profile 24 is complementary to the frequency response 21, so that it is suitable for providing pre-emphasis in the manner shown in FIG. 4 for the "long" transmission line. Similarly, the gain profile 26 is complementary to the frequency response 22, so that is particularly suitable for providing pre-emphasis for the "very long" transmission line.

The above discussion demonstrates that the frequency response of a driver according to FIG. 5 can be adjusted (tuned) by altering the width $W_2$.

Figure 7:
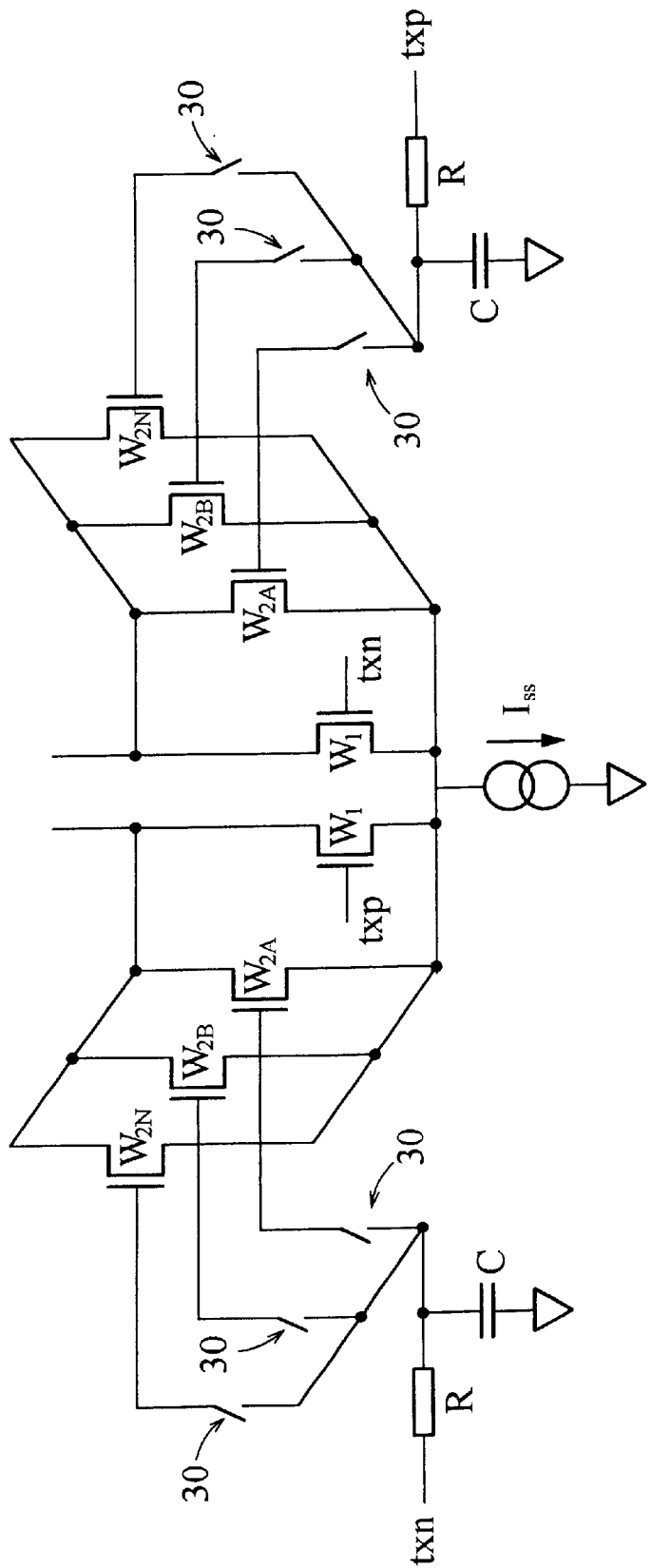
FIG. 7 shows a second driver according to the invention.

FIG. 7 shows an embodiment of the invention in which such tuning may be achieved without replacement of components. The circuit of FIG. 7 may be thought of as a multiple input differential pair. Each of the transistors 15,17 of FIG. 5 is replaced with a set of N (N≧2) transistors (in FIG. 7 N=3). The switches 30 can select any combination of the transistors (corresponding sets of transistors should be selected for each of the signals txp and txn). To use the terminology of FIG. 5, the more transistors that are selected the larger the effective total width of $W_2$ and the lower $\omega_2$ becomes. The N transistors for each of txp and txn can be implemented using a binary weighting so that $2^N$ combinations of settings of $W_2$ are possible.

The advantages of this approach to pre-emphasis are:
1) The use of passive components is reduced to a minimum.
2) Matching of pre-emphasis to interconnect is determined by transistor dimensions which are accurately manufactured and modelled.
3) It is possible to get gain out of the driver so that the worst case pulse has larger amplitude than would otherwise be possible with a conventional passive pre-emphasis filter.
4) This approach is amenable to low voltage operation due to the low number of devices in series.

In many speed applications the low pass filter function may be implemented with capacitors since these are sufficient to load the pre-driver to roll off above the frequencies of interest.

FIG. 8 illustrates the calibration of pre-emphasis. When programmable pre-emphasis is applied to an interconnect of unknown frequency response, or it is desired to fine tune the pre-emphasis to compensate for process variation, a calibration cycle is performed. This adjusts the settings of the filter until its response best cancels that of the interconnect.

The transceivers in which we apply these pre-emphasis techniques have mixers which adjust the phase of the receiver clock in pre-determined phase steps. This technique measures the data width of the worst case pattern using the mixers and is shown in the diagram below. The mixers move the sample point across the data pulse as shown in FIG. 8. Therefore the result is a logic low, then high, and finally a low again. Pre-emphasis is increased until it takes a known number of phase steps to move the sample point across the data pulse (i.e. the pulse width measurement is correct).

A system according to the invention which can perform this method automatically (e.g. when instructed to do so) is shown in FIG. 9. The system for setting the pre-emphasis operates as follows:

Step 1: The transmitter 35 is set with its pre-emphasis at minimum. It receives and re-transmits the worse case pattern (e.g. 13 0s and a 1) as a serial data stream.

Step 2: The receiver 36 spins its phase until the 1 is located in a pre-determined location at the parallel data output of the receiver (e.g. bit 0). If the 1 cannot be located then the pre-emphasis at the transmitter 35 is increased until the 1 is located.

Step 3: The phase is decremented until the 1 is no longer present in the located bit position using the mixer. This positions the sample point at the start of the bit because it is possible to begin with the 1 initially located in the correct location in step 2.

Step 4: The phase is now incremented so that the sample point is swept across the 1 until it is no longer present in the bit location and the number of increments counted.

Step 5: If the number of increments is less than the value for the correct pulse width then calibration control 37 increments the pre-emphasis at the transmitter 35 and the procedure from step 2 is repeated.

This procedure does not require any data alignment to be performed which is advantageous since the frequency response of the interconnect could prevent alignment being maintained. Note that the approach takes into account process variation of the filter components and transistor gains since they are included in the measurement procedure. Also, no extra high speed hardware is required but a simple control function would need to be implemented.

Figure 10:
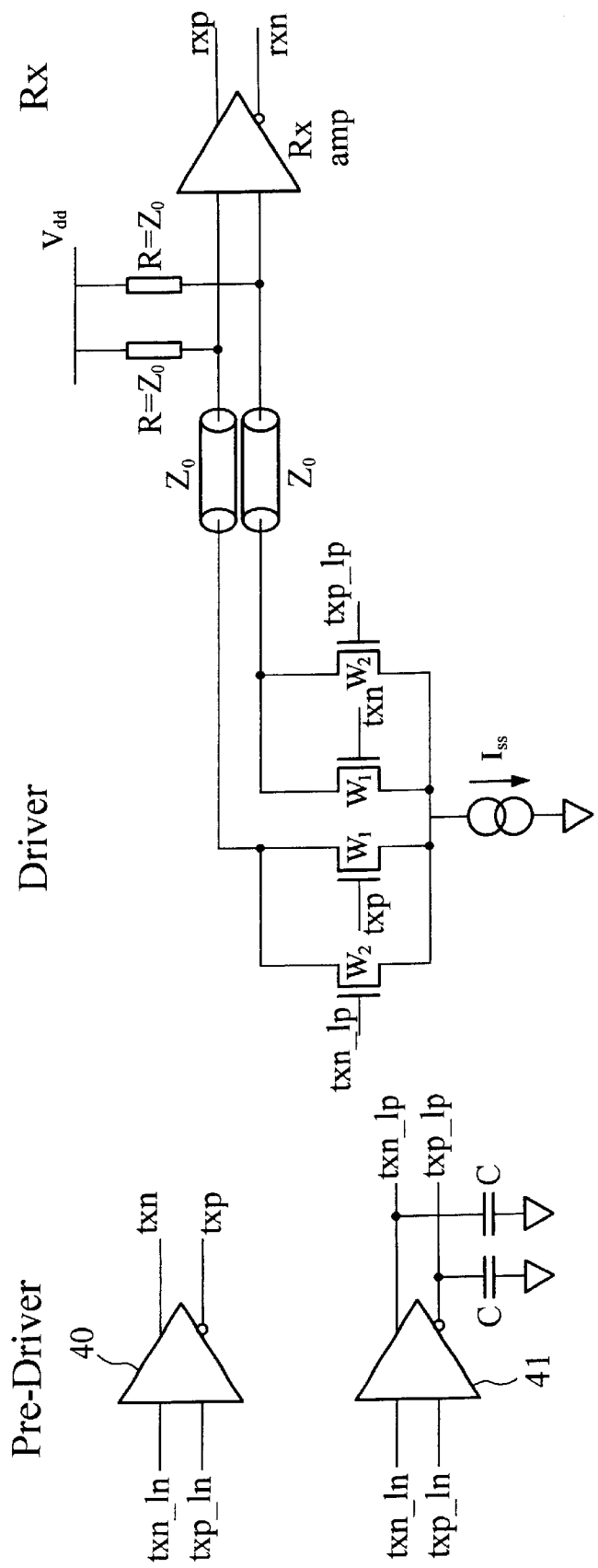
FIG. 10 illustrates a third driver according to the invention.

FIG. 10 an alternative embodiment of the invention is shown. The pre-driver section of the embodiment includes separate pre-drivers 40, 41 to produce the signals txn, txp which provide the basic transmitted signal (without pre-emphasis), and the signals txn_ip, txp_ip which are used to provide the pre-emphasis.

Although the invention has been described above in relation to particular embodiments, many variations are possible within the scope of the invention as will be clear to a skilled person. For example, any or all of the capacitors may be replaced by transistor circuitry to emulate them.

What is claimed is:

1. A data transmission system including:
    a pair of electrical transmission lines;
    a current source connected to each of said lines;
    a transmission regulator which is arranged to receive data as two opposite input signals, and to transmit the data along the transmission lines as a difference between the currents at a first end of the lines; and
    measurement means for the difference between the currents at a second end of the lines, and from the difference extracting the data;
    wherein the transmission regulator is arranged to divide each input signal into two components, and for each input signal:
        to modify the current in a respective first on of the transmission lines using a first component of that input signal, and
        to apply a low-pass filter to the other component of that input signal, and using the output of the low-pass filter to modify the current in the respective other one of the transmission lines;
    whereby the difference between the currents in the two lines is greater for higher frequency components than for low frequency components.

2. A system according to claim 1 in which the output of said low-pass filter is arranged to control at least one regulator element which regulates a current directed into the respective other one of the transmission lines.

3. A system according to claim 2 in which there are a pluraliy of regulator elements, and switching means which are arranged to determine which of the regulator elements the output of said low-pass filter controls.

4. A system according to claim 2 in which the at least one regulator element is a transistor.

5. A method of calibrating a system according to claim 1, the method including:

generating two opposite signals, each signal being a series of pulses of known duration;

applying said two opposite signals to said system as said two opposite input signals;

measuring duration pulses received by the measurement means; and modifying the low pass filter to increase the degree to which high frequency components are transmitted along the lines until the measured duration of the received pulses is equal to the known duration of the generated pulses to within a predetermined tolerance.

6. A driver for a data transmission system including a pair of electrical transmission lines and measurement means for measuring a difference between currents flowing in the lines, the driver including:

a current source for connection to the lines;

a transmission regulator for receiving data encoded in two opposite input signals, and for transmitting the data along transmission lines as a difference between the currents at a first end of the lines characterized in that the transmission regulator is arranged to divide each input signal into two components, and for each input signal:

to modify the current in a respective first one of the transmission lines using a first component of that input signal, and to apply a low-pass filter to the other component of that input signal, and using the output of the low-pass filter to modify the current in the respective other one of the transmission lines;

whereby the difference between the currents in the two lines is greater for higher frequency components than for low frequency components.

7. A driver according to claim 6 in which the output of said low-pass filter is arranged to control at least one regulator element which regulates a current along the respective other one of the transmission lines.

8. A driver according to claim 7 in which there are a plurality of regulator elements, and switching means which are arranged to determine which of the regulator elements the output of said low-pass filter controls.

9. A driver according to claim 7 in which the at least one regulator element is a transistor.

* * * * *